(12) United States Patent
Toops

(10) Patent No.: US 7,145,822 B2
(45) Date of Patent: Dec. 5, 2006

(54) METHOD AND APPARATUS FOR OPTIMAL WRITE RESTORE FOR MEMORY

(75) Inventor: David J. Toops, Terrell, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/071,012

(22) Filed: Mar. 3, 2005

(65) Prior Publication Data

US 2006/0198218 A1 Sep. 7, 2006

(51) Int. Cl.
*G11C 7/00* (2006.01)

(52) U.S. Cl. .................................... 365/203

(58) Field of Classification Search ................. 365/203
See application file for complete search history.

(56) References Cited

U.S. PATENT DOCUMENTS

| | | | |
|---|---|---|---|
| 5,995,431 A | 11/1999 | Inui et al. | |
| 6,005,794 A | 12/1999 | Sheffield et al. | |
| 6,226,215 B1 * | 5/2001 | Yoon | 365/230.03 |
| 6,288,928 B1 * | 9/2001 | Shinozaki | 365/63 |
| 6,333,881 B1 * | 12/2001 | Kusunoki et al. | 365/203 |
| 6,459,641 B1 * | 10/2002 | Fujioka et al. | 365/220 |
| 6,552,923 B1 | 4/2003 | Houston | |
| 6,631,093 B1 * | 10/2003 | Kumar et al. | 365/203 |
| 6,674,684 B1 * | 1/2004 | Shen | 365/230.03 |
| 6,731,564 B1 | 5/2004 | Tran et al. | |

* cited by examiner

*Primary Examiner*—Amir Zarabian
*Assistant Examiner*—Anthan Tran
(74) *Attorney, Agent, or Firm*—Alan K. Stewart; W. James Brady; Frederick J. Telecky, Jr.

(57) ABSTRACT

According to one embodiment of the present invention a memory subsystem comprises a column and a column select signal line. The column comprises at least one bit line and a write precharge circuit. The write precharge circuit is operable to provide at least a portion of a charge on the at least one bit line. The column select signal line is operable to provide a column select signal selecting the column for a write operation. The write precharge circuit is gated with the column select signal line such that the column select signal is communicated to the write precharge circuit upon selection of the column for the write operation. The write precharge circuit is operable to at least partially restore the charge on the at least one bit line upon receipt of the column select signal after the write operation.

4 Claims, 4 Drawing Sheets

METHOD AND APPARATUS FOR OPTIMAL WRITE RESTORE FOR MEMORY

TECHNICAL FIELD OF THE INVENTION

This invention relates in general to the field of memory and, more particularly, to a method and apparatus for optimal write restore for memory.

BACKGROUND OF THE INVENTION

Memory is used in a variety of electronic devices, including, but not limited to, computers, microprocessors, digital equipment, phones, personal digital assistants (PDA). One type of a memory is static random access memory ("SRAM"), which is generally a memory that loses data upon loss of normal operating power. SRAM is generally faster and considered more reliable than DRAM because it does not need to be refreshed. However, concerns with SRAM involve power consumption. Such a concern is exacerbated when SRAM is utilized in portable devices relying on portable power devices such a batteries.

SUMMARY OF THE INVENTION

According to one embodiment of the present invention a memory subsystem comprises a column and a column select signal line. The column comprises at least one bit line and a write precharge circuit. The write precharge circuit is operable to provide at least a portion of a charge on the at least one bit line. The column select signal line is operable to provide a column select signal selecting the column for a write operation. The write precharge circuit is gated with the column select signal line such that the column select signal is communicated to the write precharge circuit upon selection of the column for the write operation. The write precharge circuit is operable to at least partially restore the charge on the at least one bit line upon receipt of the column select signal after the write operation.

Certain embodiments may provide a number of technical advantages. For example, a technical advantage of one embodiment may include the capability to reduce the amount of power needed to recharge a bit line. Other technical advantages of other embodiments may include the capability to speed up the pre-charge of the bit lines.

Although specific advantages have been enumerated above, various embodiments may include all, some, or none of the enumerated advantages. Additionally, other technical advantages may become readily apparent to one of ordinary skill in the art after review of the following figures, description, and claims.

BRIEF DESCRIPTION OF THE DRAWINGS

To provide a more complete understanding of the present invention and features and advantages thereof, reference is made to the following description, taken in conjunction with the accompanying figures, wherein like reference numerals represent like parts, in which.

DETAILED DESCRIPTION OF EXAMPLE EMBODIMENTS

It should be understood at the outset that although example implementations of embodiments of the invention are illustrated below, the present invention may be implemented using any number of techniques, whether currently known or in existence. The present invention should in no way be limited to the example implementations, drawings, and techniques illustrated below. Additionally, the drawings are not necessarily drawn to scale.

Figure 1:
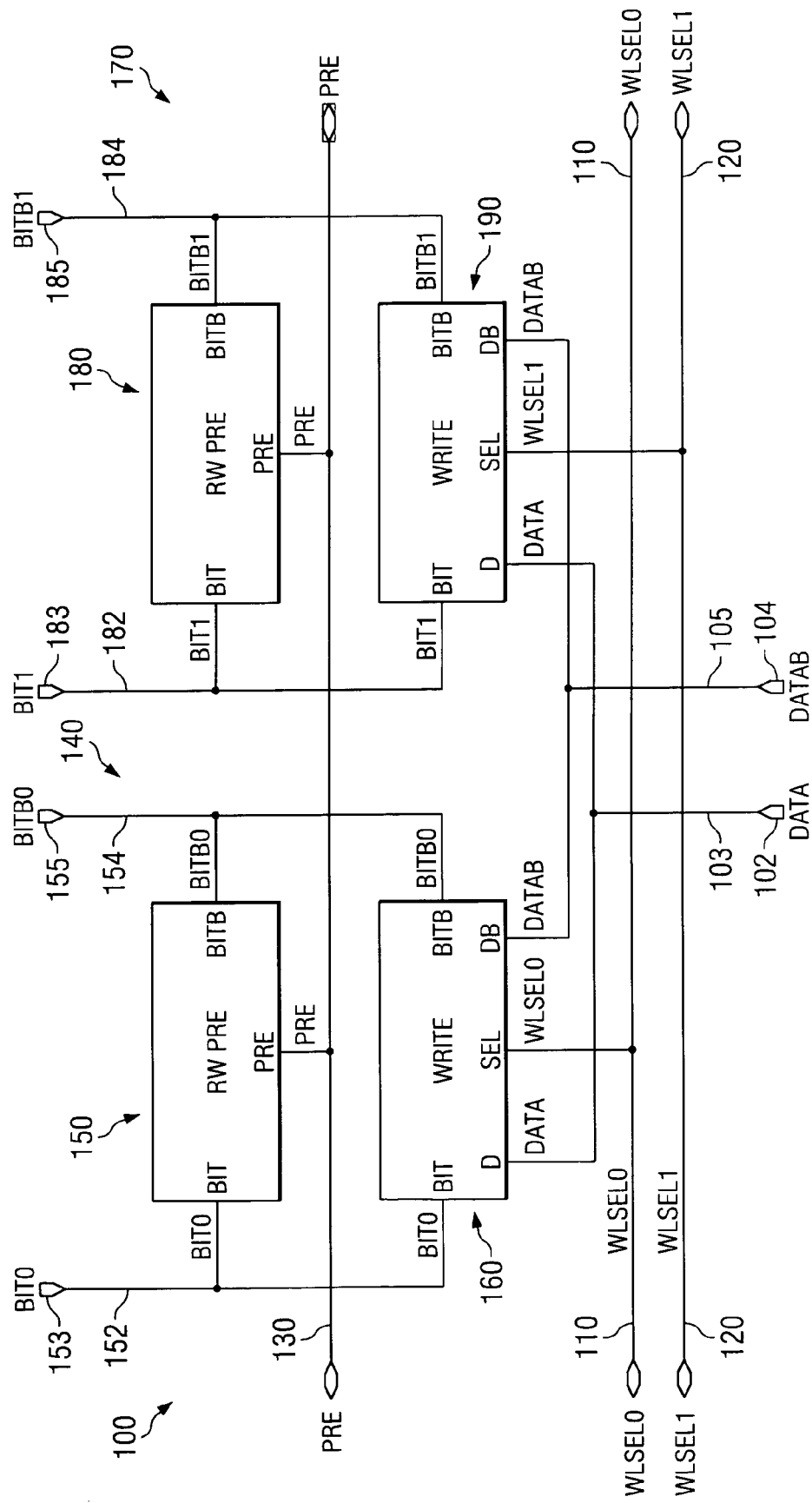
FIG. 1 is a general illustration of a memory subsystem.

FIG. 1 is a general illustration of a conventional memory subsystem 100. Such a memory subsystem 100, for example, may be illustrative of a portion of a six transistor (6T) static random access memory (SRAM) configuration. The memory subsystem 100 in FIG. 1 generally includes two columns 140, 170 which may be associated with a column mux unit (not expressly shown).

Each of the columns 140, 170 generally includes a read/write precharge circuit 150, 180 and a write circuit 160, 190. The read/write precharge circuits 150, 180 may generally be operable to provide a charge to the respective bit lines 152, 182 and bit bar lines 154, 184, associated therewith. The bit lines 152, 182, and bit bar lines 154, 184 may generally be in communication with a memory cell (not explicitly shown) for a read or write operation through outputs 153, 155, 183, 185.

During a read or write operation, bit lines 152, 182, and bit bar lines 154, 184 at the start of a cycle may initially be charged high (e.g., at a logic "1") by the read/write precharge circuits 150, 180. In a write operation, one of the columns 140 or 170 is selected to write by communicating a column select signal on line 110 or 120 (e.g., column select signal WLSEL0 for column 140 or column select signal WSEL1 for column 170) to the write circuit 160 or 190. The write circuits 160, 190 receives data from inputs 102, 104, communicated through data lines 103, 105. The data may communicate a logic "1" or "0" to the write circuit, which may, in turn, cause the combination of the bit line 152 and the bit bar lines 154 or the combination of the bit line 182 and the bit bar lines 184 to be pulled to a logic 0, writing to the cell through the combination of outputs 153 and 155 or combination of the outputs 183, 185. One of the bit line 152 and the bit bar line 154, or one of the bit line 182 and the bit bar lines 184 may be pulled to ground by transferring the charge associated therewith to the memory cell via the corresponding outputs 153, 155, 183, 185.

In a read operation, one of the bit line 152 and the bit bar line 154 or one of the bit line 182 and the bit bar lines 184 is pulled low, for example, not to ground. As an illustration, one of the bit line 152 and the bit bar line 154 or one of the bit line 182 and the bit bar lines 184 may be pulled down by a hundred millivolts. Thus, the read operations generally drains the bit lines less than the write operations.

After a read or a write operation, the read/write precharge circuits 150, 180 may be restored to a logic "1" by asserting the precharge signal, PRE, on the precharge signal line 130. The precharge signal line 130 may be gated (not expressly shown) with each of the precharge circuits 150, 180 to recharge the bit lines 152, 182 and the bit bar lines 154, 184. In such an operation, regardless of the column 140 or 170 that actually wrote to or read from the memory cell, all of the read/write precharge circuits 150, 180 coupled to the pre charge signal line 130 receives the precharge signal, PRE. Thus, the precharge signal, PRE, communicated through the precharge signal line 130 initiates a global restoration of all the precharge circuits 150, 180 in communication with precharge signal line 130. Such a global restoration of read/write precharge circuits 150, 180 may be inefficient from a power standpoint.

Teachings of the invention recognize a structure that may minimize the amount of power needed to recharge the bit lines (e.g., bit line 152, 182 and the bit bar line 154, 184) after a write operation. Teachings of the invention additionally recognize a structure that may speed up the pre-charge of the bit lines (e.g., bit line 152, 182 and the bit bar line 154, 184) after a write operation.

Figure 2:
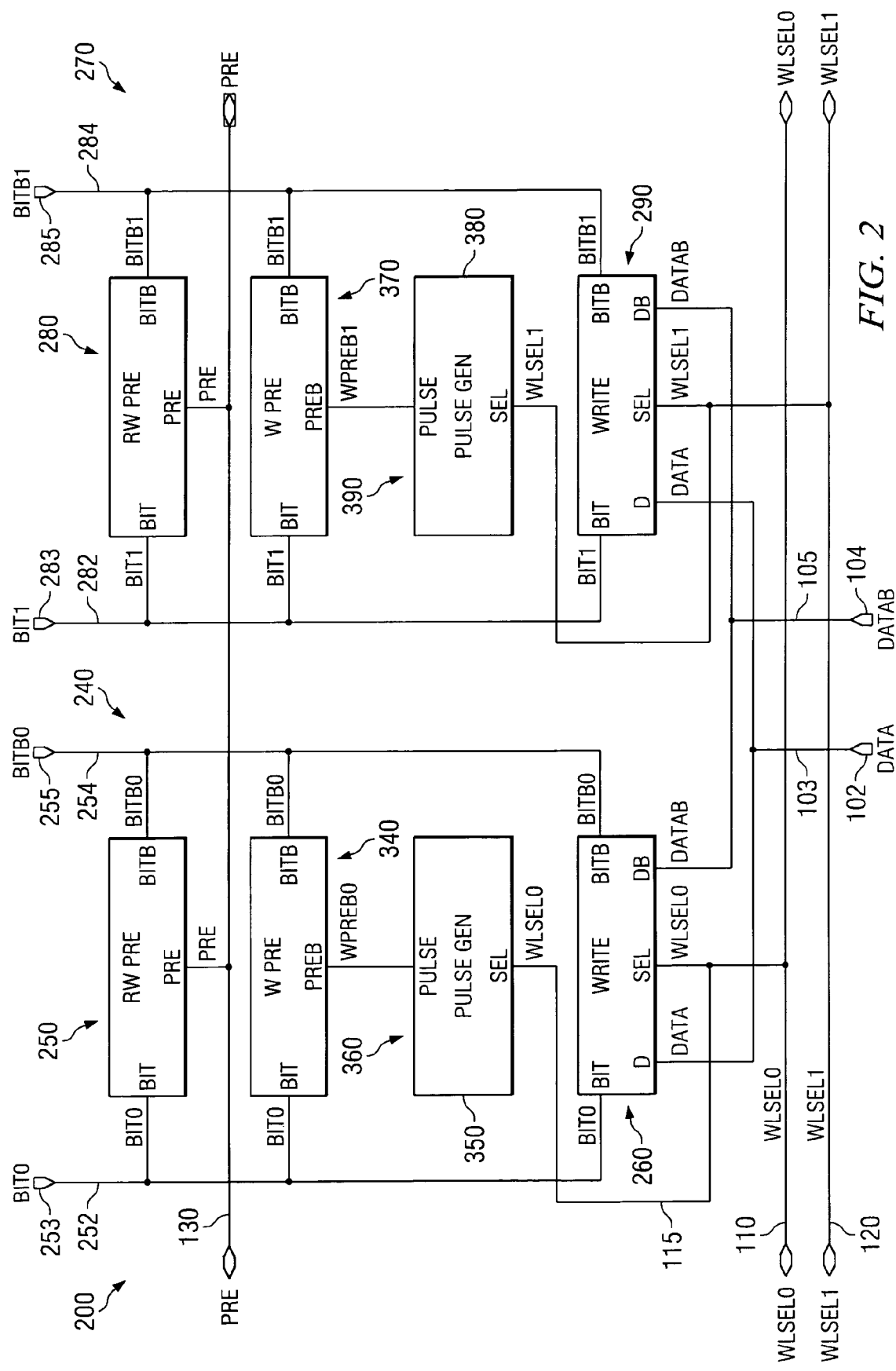
FIG. 2 is a memory subsystem, according to an embodiment of the invention

FIG. 2 is a memory subsystem 200, according to an embodiment of the invention. This embodiment of the memory subsystem 200 may have similarities as well as differences from the memory subsystem 100 of FIG. 1. Some of the differences will be discussed below. In this embodiment, the memory subsystem 200 generally includes two columns 240, 270 which may be associated with a column mux unit (not expressly shown). Although two columns 240, 270 are shown in this embodiment, other embodiments may have more columns, for example, 4, 8, 16, or more columns associated with a column mux unit. Although not explicitly shown, the memory subsystem 200 may be in communication with any of a variety of processors, other memory cells, other memory systems, other memory subsystems, and other devices.

Each of the columns 240, 270 generally includes a read/write precharge circuit 250, 280; a write circuit 260, 290; a write precharge circuit 340, 370; and a timing device 360, 390.

The memory precharge configuration 200 of FIG. 2 utilizes two precharge circuits per column 240, 270. For example, column 240 includes read/write precharge circuit 250 and write precharge circuit 340; and, column 270 includes read/write precharge circuit 280 and write precharge circuit 370. The read/write precharge circuit 250 and write precharge circuit 340 are generally operable to provide a charge on bit lines 252 and bit bar line 254 while the read/write precharge circuit 280 and write precharge circuit 370 are generally operable to provide a charge on bit line 282 and bit bar line 284. The bit lines 252, 282, and bit bar lines 254, 284 may generally be in communication with a memory cell (not explicitly shown) for a read or write operation through outputs 253, 255, 283, 285.

In general, the read/write precharge circuit 250, 280 may be utilized to restore a charge on the bit lines 252, 254 and bit bar lines 282, 284 after a read/ write operation and the write precharge circuit 340, 370 may be used to restore a charge on the bit lines 252, 254 and bit bar lines 282, 284 after write operations. Thus, for example, during a write operation with a memory cell associated with column 240, the memory cell will receive a charge generated by read/write precharge circuit 250 and the write precharge circuit 340 via outputs 253, 255. As one example, half of the charge may be generated by the read/write precharge circuit 250 and half of the charge may be generated by the write precharge circuit 340. In other embodiments, more or less of the charge may be generated by one of the precharge circuit 250 and the write precharge circuit 340. Using more than one precharge circuit to generate a charge on the bit lines 252, 254 and bit bar lines 282, 284 allows the read/write precharge circuit 250 to be reduced in size when compared, for example, to the read/write precharge circuit 150 of FIG. 1.

After a read or a write operation associated with column 240, the read/write precharge circuit 250 may be restored by communicating the precharge signal, PRE, through precharge signal line 130. In this operation, in a manner similar to that described above with reference to FIG. 1, all of the read/write precharge circuits 250, 280 coupled to the pre charge signal line 130 may receive the precharge signal, PRE. To restore the charge associated with the write precharge 340 the column select signal, WSEL0, is gated and communicated, for example, through line 115 to write precharge circuit 340 to initiate a restoration of the charge associated with the write precharge circuit 340. As the column select signal, WSEL0, is only applied to column 240 during the write operation of column 240, the write precharge circuit 340 is not globally restored with the write precharge circuit 370. In other words, by gating the column select signal to the precharge circuit only the column involved in the write operation has its write precharge circuit restored.

A similar operation may occur when column 270 is selected to write by communicating the column select signal, WSEL1, through the column select line 120 and further communicating the column select signal, WSEL1, to the write precharge circuit 370 (e.g., by gating through line 125) to initiate a restoration of the write precharge 370 after a write operation. Thus, the precharge signal, PRE, communicated through precharge signal line 130 initiates a global recharge of all the read/write precharge circuits 250, 280 in communication with line 130. And, the column select signals, WSEL0 or WSEL1, communicated to precharge circuits 340 or 370 initiate a selective recharge of the write precharge circuit 340 or 370 involved with the write operation. With such a configuration, the memory precharge configuration 200 may save on power. And, yet further power savings may be realized when large number of columns associated with a mux unit are utilized. For example, if eight columns were utilized only one of eight write precharge circuits may be restored after a write.

By selectively restoring the write precharge circuits (e.g., write precharge circuits 340, 370) in the memory precharge configuration 200 of FIG. 2, the recharging of the precharge devices (e.g., read/write precharge 250, 280 and write precharge 340) may additionally be sped up when compared, for example, to the global communication and recharging of all the precharge devices (e.g., read/write precharge 150, 180) of FIG. 1.

As briefly referenced above, the selective restoration of write precharge circuits 340 and 370 in this embodiment are accomplished by communicating the column select signals, WSEL0 and WSEL1, to the write precharge circuits 340 and 370 during write operations. A variety of gating configurations may be utilized to facilitate such a task. In this embodiment, line 115 facilitates the communication between precharge circuit 340 and line 110 and line 125 facilitates the communication between precharge circuit 370 and line 120.

The timing devices timing device 360, 390 may generally facilitate the restoration or recharging of the write precharge circuits 340, 370, by selectively communicating the column select signals, WSEL0 and WSEL1, to the write precharge circuits 340 and 370 for a determined time period. Although a variety of configurations may be utilized for this task, this embodiment includes pulse generators 350, 380. The pulse generators 350, 380 may generally convert the column select signals, WSEL0 and WSEL1, into a pulse of a length necessary to allow the charge associated with the precharge circuits 340, 370 to be restored to a proper voltage. In other words, the precharge circuits 340, 370 in this embodiment are restored in the presence of the pulse (converted column select signals) from the pulse generators 350, 380.

Figure 3:
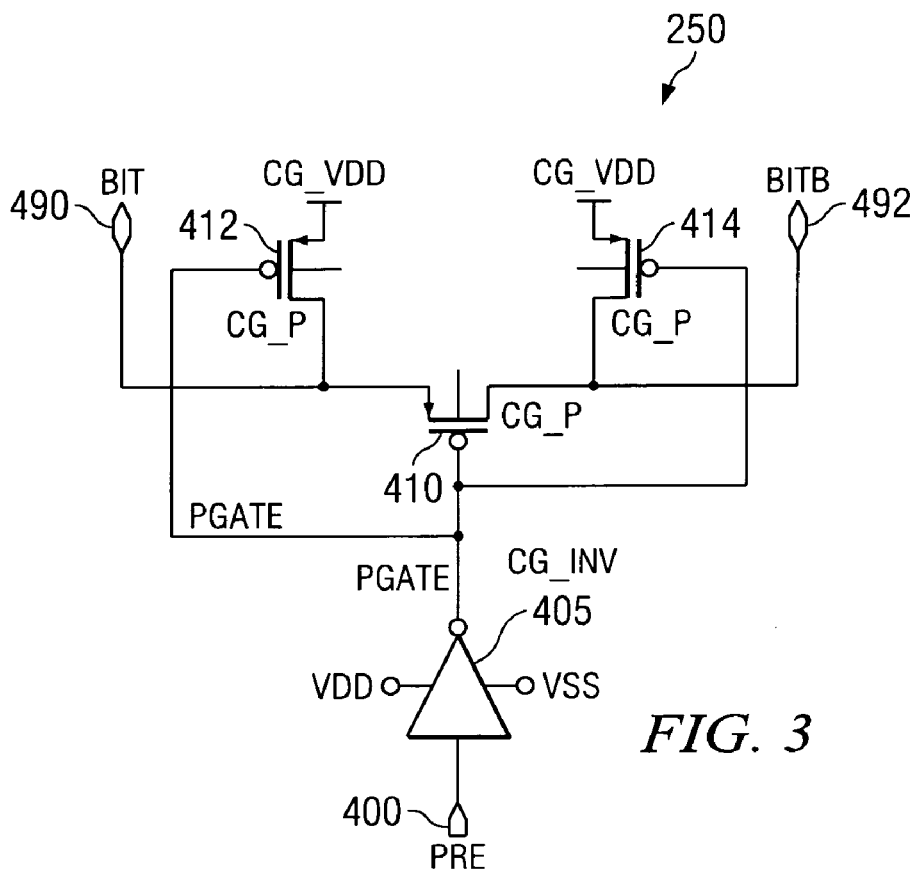
FIG. 3 is an embodiment of read/write precharge circuit.
Figure 4:
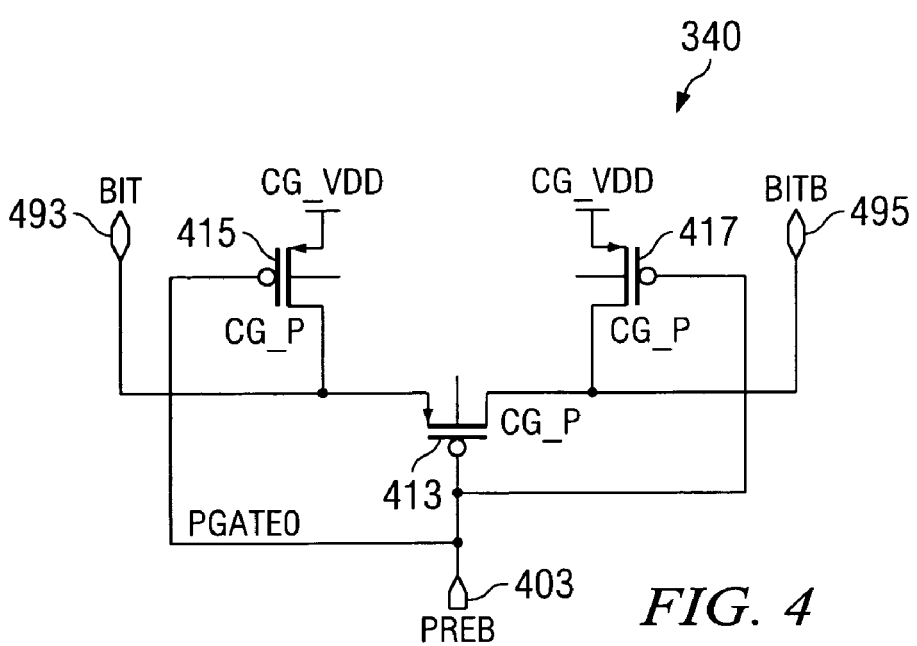
FIG. 4 is an embodiment of a write precharge circuit.

FIG. 3 is an embodiment of read/write precharge circuit 250 and FIG. 4 is an embodiment of a write precharge circuit 340. Although particular embodiments are disclosed with reference to FIGS. 3 and 4, other read/write precharge circuits and write precharge circuits may be utilized to charge the bit lines and the bit bar lines. The embodiments of FIGS. 3 and 4 use general p-channel transistor configurations. These p-channel transistor configurations are generally operable upon receiving a signal to provide a charge on the bit line 252 and the bit bar line 254 (not explicitly shown). With general reference in this document to a recharging, restoring, or recharging of a charge on a bit line or a bit bar line, it should also be understood that the general reference to recharging, restoring, or recharging the read/write precharge circuit or write precharge circuit has a similar meaning as the read/write precharge circuit or the write precharge circuit provides the charge for the bit lines and bit bar lines.

Both the read/write precharge circuit 250 and write precharge circuit 340 generally include inputs 400, 403 and outputs 490, 492, 493, 495. Inputs 400, 403 are generally operable to receive a signal. For example, read/write precharge circuit 250 may generally receive the precharge signal, PRE, of FIG. 2 and the write precharge circuit 340 may generally receive the column select signal, WSEL1, of FIG. 2 (e.g., converted to a pulse form). The read/write precharge of FIG. 3 generally includes an inverter 405, which may generally facilitate obtainment of the correct phase—e.g., from signals received from input 400. A similar inverter is not shown in FIG. 4 as the correct phase may come from the output of the pulse generator (e.g., pulse generator 350 of FIG. 2).

Outputs 490, 492, 493, and 495 are generally operable to place a charge on the bit bar line 252 and bit bar lines 254 (not explicitly shown). To facilitate these operations, both the read/write precharge circuit 250 and write precharge circuit 340 include three transistors 410, 412, 414 and 413, 415, and 417. Transistors 412, 414, 415, and 417 facilitate pulling the charge up on the bit bar line 252 and bit bar line 254—e.g., using power supply voltages, VDD. Transistors 410 and 413 facilitate an equalization across a charge between the output 490 and 492 and output 493 and 495.

Although a p-channel configurations have been shown in the embodiments of FIGS. 3 and 4, in other embodiments, other configurations may be utilized, including, but not limited to n-channel configurations.

Figure 5:
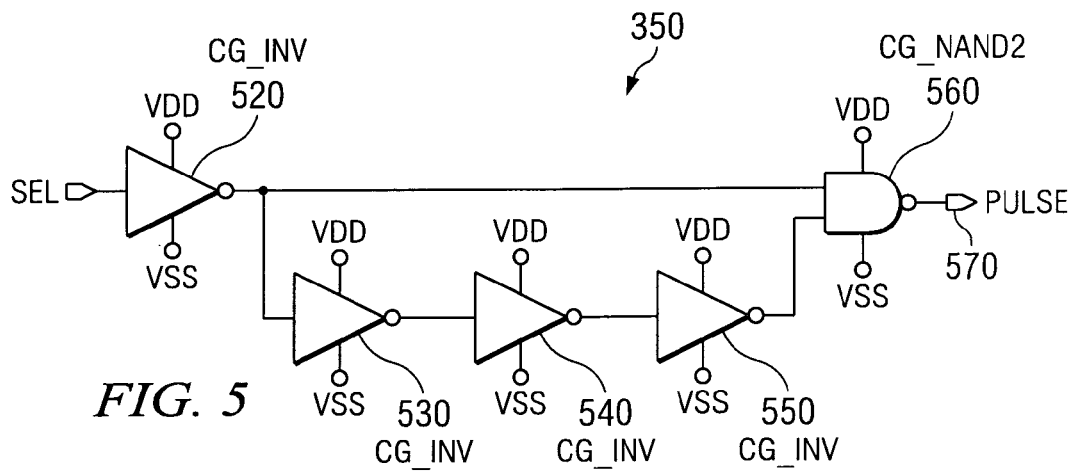
FIG. 5 is an embodiment of a pulse generator.

FIG. 5 is an embodiment of a pulse generator 350. As briefly referenced above, the pulse generators 350 may generally determines how long the write precharge circuits 340 will receive a charge. The pulse generator 560 in this embodiment generally includes a nand gate 560 and four inverters 520, 530, 540, and 550. The nand gate 560 and each of the inverters 520, 530, 540, and 550 generally include a power supply voltage, VDD, and a ground, VSS.

In operation, the pulse generator 350 may take a falling edge of the column select signal (e.g., the WSEL0 signal from line 110) at an input 510 and converts it to a negative pulse at the output 570. The negative pulse of the output 570 is fed into the input 403 referenced above in FIG. 4. The number of inverters may generally determine a length of the pulse. Although three inverters are shown in this embodiment, more or less may be used in other embodiments, for example, 3, 5, 7 or more. The length of the pulse generated by the pulse generator 350 may generally be set to how long the write precharge device 340 needs to be turned on to restore the bit lines to the proper voltage.

Figure 6:
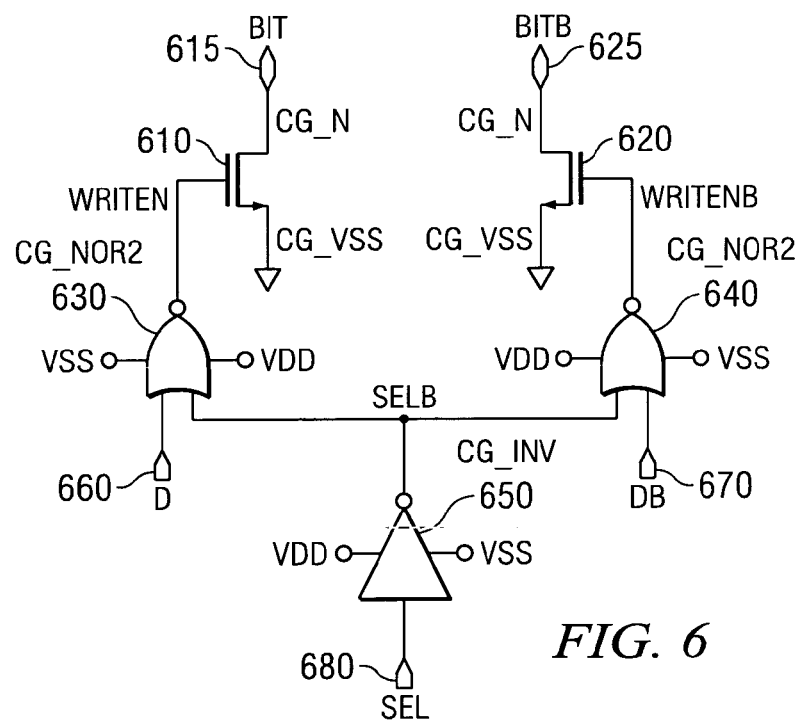
FIG. 6 is an embodiment of a write circuit.

FIG. 6 is an embodiment of a write circuit 260. The write circuit 260 may generally facilitate a writing to a memory cell. In this embodiment the write circuit 260 includes n-channel pull down devices or transistors 610, 620, nor gates 630 and 640, and an inverter 650. Each of the transistors 610, 620 include a ground. Each of the nor gates 630, 640 include a voltage power supply, VDD, and a ground, VSS.

In operation, input 680 receives the column select signal, WLSEL0, from column select line 110. Input 660 receives a DATA signal from the true data line 103 and input 670 receives a DATAB signal from the compliment data line 105. Output 615 is in communication with bit line 252 and output 625 is in communication bit bar line 254. As referenced above in FIG. 2, the outputs 253 of bit line 252 and output 255 of the bit bar line 254 may be in communication with the memory cells. Although a direct write configuration (pull down devices connected directly to the bitline) is shown in this embodiment, in other embodiments the bitlines may first go through the muxing unit and then be pulled down after the mux.

Numerous other changes, substitutions, variations, alterations, and modifications may be ascertained to one skilled in the art and it is intended that the present invention encompass all such changes, substitutions, variations, alterations, and modifications as falling within the scope of the appended claims.

What is claimed is:

1. A memory subsystem, comprising:
   a column comprising:
      at least one bit line,
      a write precharge circuit operable to provide at least a portion of a charge on the at least one bit line,
      a read/write precharge circuit operable to provide at least another portion of the charge on the at least one bit line;
   a column select signal line operable to provide a column select signal selecting the column for a write operation;
   a precharge signal line operable to communicate a precharge signal to the read/write circuit;
   wherein the write precharge circuit is gated with the column select signal line such that the column select signal is communicated to the write precharge circuit upon selection of the column for the write operation and is further operable to at least partially restore the charge on the at least one bit line upon receipt of the column select signal after the write operation;
   wherein the read/write precharge circuit is operable to at least partially restore the charge on the at least one bit line upon receipt of the precharge signal after the write operation;
   a pulse generator in communication with the write precharge circuit, wherein the pulse generator has the column select signal as an only input signal and the pulse generator is operable to convert the column select signal to a pulse having a length such that a charge associated with the write precharge circuit is restored.

2. The memory subsystem of claim 1, further comprising:
   a second column, comprising:
      at least a second bit line,
      a second write precharge circuit operable to provide at least a portion of a charge on the at least a second bit line,
      a second read/write precharge circuit operable to provide at least another portion of the charge on the at least a second bit line; and
   wherein the precharge signal is further operable to communicate the precharge signal to the second read/write precharge circuit.

3. The memory subsystem of claim 1, wherein the column further comprises:
   a write circuit operable to write to a memory cell in a write operation in response to receiving a column select signal and at least one data signal.

4. The memory subsystem of claim 1, wherein
   the precharge signal line is further operable to communicate a precharge signal to the read/write circuit after a read operation.

* * * * *